United States Patent
Davies

(10) Patent No.: US 6,448,845 B2
(45) Date of Patent: *Sep. 10, 2002

(54) TRIMMABLE REFERENCE GENERATOR

(75) Inventor: Thomas J. Davies, Albuquerque, NM (US)

(73) Assignee: Koninklijke Philips Electronics N.V., Eindhoven (NL)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/408,789

(22) Filed: Sep. 30, 1999

(51) Int. Cl.[7] ............... G05F 1/10; G05F 3/02
(52) U.S. Cl. ........................ 327/540; 327/538
(58) Field of Search ............... 327/540, 538, 327/541, 91, 94, 95, 96; 307/38, 36, 37

(56) References Cited

U.S. PATENT DOCUMENTS

| | | | | |
|---|---|---|---|---|
| 4,040,408 A | * | 8/1977 | Kraus et al. ............... | 123/688 |
| 4,709,225 A | | 11/1987 | Welland et al. ........... | 340/347 |
| 4,952,821 A | * | 8/1990 | Kokubun ................... | 307/350 |
| 5,168,174 A | | 12/1992 | Naso et al. | |
| 5,319,370 A | | 6/1994 | Signore et al. ............ | 341/120 |
| 5,546,042 A | * | 8/1996 | Tedrow et al. ............ | 327/540 |
| 5,793,249 A | | 8/1998 | Chen et al. ................ | 327/561 |
| 6,118,706 A | | 9/2000 | Smayling et al. | |

OTHER PUBLICATIONS

IBM Technical Disclosure Bulletin, "Switched Capacitor Voltage Reference That Approaches the Power Supply Rail"; vol. 31, No. 10, Mar. 1989, pp. 273–275.

* cited by examiner

Primary Examiner—Terry D. Cunningham
Assistant Examiner—Quan Tra

(57) ABSTRACT

A programmable reference voltage controls a high-voltage source via a programmable voltage divider. The programmable voltage divider scales a fixed reference voltage to a scaled reference value that is used to control the generation of a high voltage source. A comparator provides a feedback signal that is based on a difference between the scaled reference voltage and a scaled output voltage. This feedback signal controls the voltage-controlled output voltage source, so as to track the scaled reference value. In a preferred embodiment, the scale factor associated with the output voltage remains constant, whereas the scale factor associated with the reference voltage is programmable. In alternative embodiments of this invention, the reference scaling factor defaults to a mid-range value, and a bias offset is provided to easily select an output voltage value for either programming or erasing the contents of a programmable memory device.

11 Claims, 4 Drawing Sheets

TRIMMABLE REFERENCE GENERATOR

BACKGROUND OF THE INVENTION

1. Field of the Invention

This invention relates to the field of electronic devices, and in particular to voltage generators for memory devices.

2. Description of Related Art

The reliability, or longevity, of a semiconductor memory device has been found to be related to the stress imposed on the device by rapid voltage transitions, particularly rapid high voltage transitions used to write or erase the memory contents.

Electrically erasable (EE) memory devices are particularly well suited for techniques that control the application of stress-inducing voltage transitions in order to improve the longevity of the device. Typically, EE devices are used as programmable read-only memories, wherein the EE device is relatively infrequently programmed to contain a data set that is frequently read. Because the programming is relatively infrequent, the speed at which the programming occurs is not as critical as other parameters of the design, and in particular, less critical than the longevity of the device.

FIG. 1 illustrates an example voltage generator 100 commonly used for programming and erasing an electrically erasable memory device. The generator 100 is designed to provide an output voltage 165 that increases from zero volts to a high voltage reference voltage at a controlled rate. The value of the high voltage reference, typically in the 10 to 12 volt range, is determined by fabricating and testing samples of the device to determine an optimal value, based on process parameters and other factors. A reference voltage Vref 115 is provided for controlling the peak value of the output voltage 165, typically from a band-gap voltage source, common in the art. The controller 190 effects a charge transfer from the source of the reference voltage 115 to a comparator 150, via switches S1 110 and S2 120, and capacitors C1 130 and C2 140, using techniques common in the art. The controller 190 asserts switch control Sa 101 to effect a charging of capacitor C1 130 to the reference voltage 115, while de-asserting switch control Sb 102 to isolate capacitor C1 130 from C2 140. Thereafter, the controller 190 de-asserts switch control Sa 101 and asserts switch control Sb 102, thereby isolating capacitor C1 130 from the reference voltage Vref 115, and coupling the capacitors C1 130 and C2 140 together. If the voltage of capacitor C2 140 at the time of coupling to capacitor C1 130 is less than the voltage on the capacitor C1 130 (which, at the time of coupling, is equal to the reference voltage 115), capacitor C1 130 transfers charge to capacitor C2 140, thereby raising the voltage level of capacitor C2 140. The ratio of the capacitance of capacitor C1 130 and capacitor C2 140, and the difference in voltage between the capacitors 130, 140 at the time of coupling, determine the amount of the voltage increase at each coupling. Using this charge transfer technique, common in the art, the voltage Vramp 145 on the capacitor C2 140 increases asymptotically to the voltage reference 115, the rate of increase being determined by the ratio of the capacitance of the capacitors 130, 140.

A voltage controlled high-voltage source 160 provides the high-voltage output 165. The control voltage 155 that controls the high-voltage source 160 is provided by a closed-loop feedback system comprising a scaler 170 and the comparator 150. The scaler 170 scales the high-voltage output 165 by a factor S, and this scaled voltage 175 is compared to the aforementioned voltage Vramp 145. The feedback control signal 155 controls the high-voltage output 165 to track the Vramp 145 signal, at the scale factor S. That is, if the scale factor S is 5/8, the high-voltage output 165 is 8/5*Vramp 145. Because Vramp 145 increases to Vref 115, the high-voltage output 165 increases to 8/5*Vref 115. After providing the increasing high-voltage output 165 to the device that utilizes this voltage source, such as an EE memory device, the controller 190 closes switch S0 180 to deplete the charge on capacitor C2 and reduce its voltage to zero, thereby reducing the output voltage 165 to zero. The above process is repeated as required, whenever the increasing output voltage 165 is required.

As mentioned above, the peak of the high-voltage output 165 is preferably trimmed to optimize the longevity of the device that receives this high-voltage output 165. This trim is effected by modifying the scale factor S, typically by physically modifying the devices that form the scaler 170. For example, a conventional scaler 170 is a capacitor divider circuit, and the trimming of the scaler is effected by increasing or decreasing the plate area of one or more of the capacitors forming the scaler 170. This typically requires a change to at least one of the metal masks used to fabricate the device, and cannot be economically applied to customize the high-voltage output 165 of individual voltage generators 100.

SUMMARY OF THE INVENTION

It is an object of this invention to provide a high-voltage generator that can be trimmed without a mask change. It is a further object of this invention to provide a voltage generator that can be individually trimmed after fabrication. It is a further object of this invention to provide a high-voltage generator that can be optimized for writing and erasing electrically erasable programmable devices.

These objects, and others, are achieved by providing a programmable reference voltage that is used for controlling a high-voltage source. A programmable voltage divider is used to scale a fixed reference voltage to a scaled reference value that is used to control the generation of a high voltage source. A comparator provides a feedback signal that is based on a difference between the scaled reference voltage and a scaled output voltage. This feedback signal controls the voltage-controlled output voltage source, so as to track the scaled reference value. In a preferred embodiment, the scale factor associated with the output voltage remains constant, whereas the scale factor associated with the reference voltage is programmable. In alternative embodiments of this invention, the reference scaling factor defaults to a mid-range value, and a bias offset is provided to easily select an output voltage value for either programming or erasing the contents of a programmable memory device.

BRIEF DESCRIPTION OF THE DRAWINGS

The invention is explained in further detail, and by way of example, with reference to the accompanying drawings wherein.

DETAILED DESCRIPTION OF THE INVENTION

Figure 1:
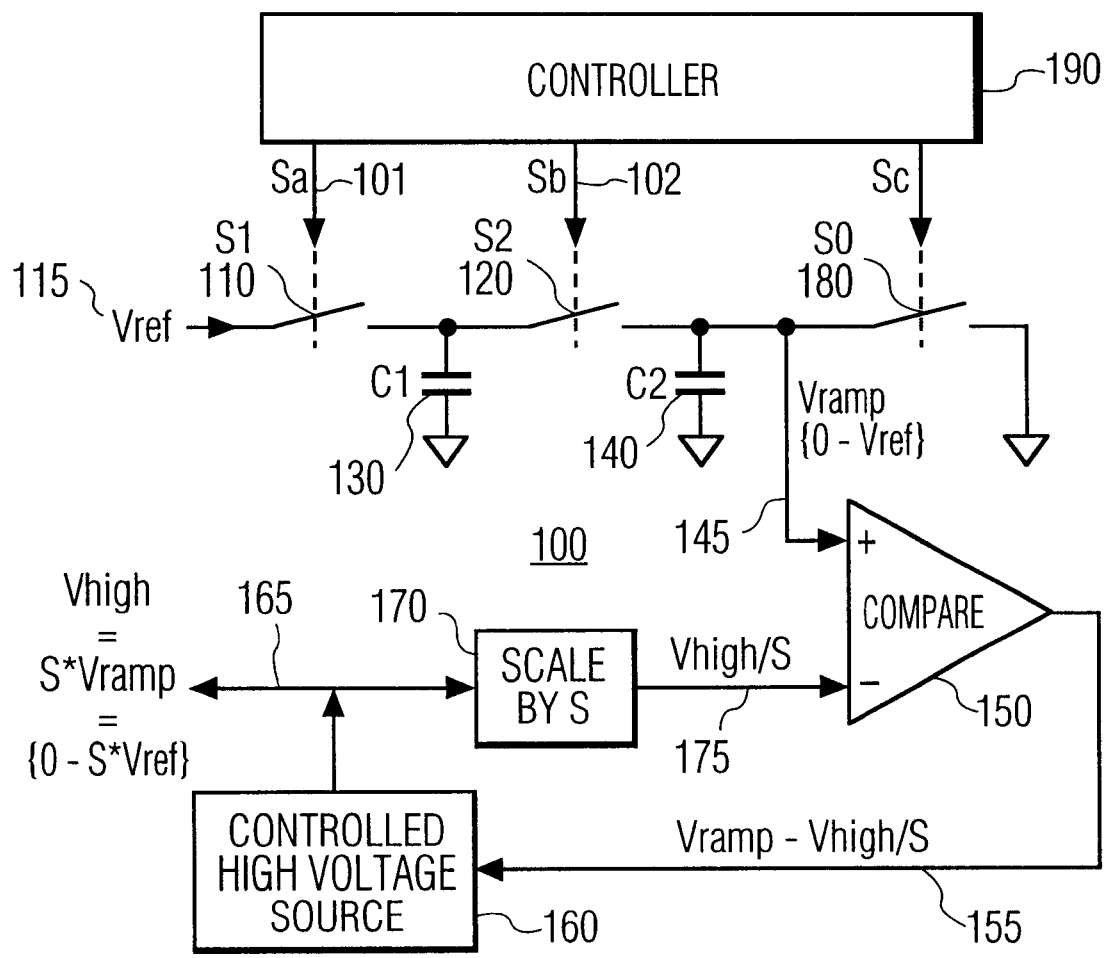
FIG. 1 illustrates an example prior art high-voltage reference generator.
Figure 2:
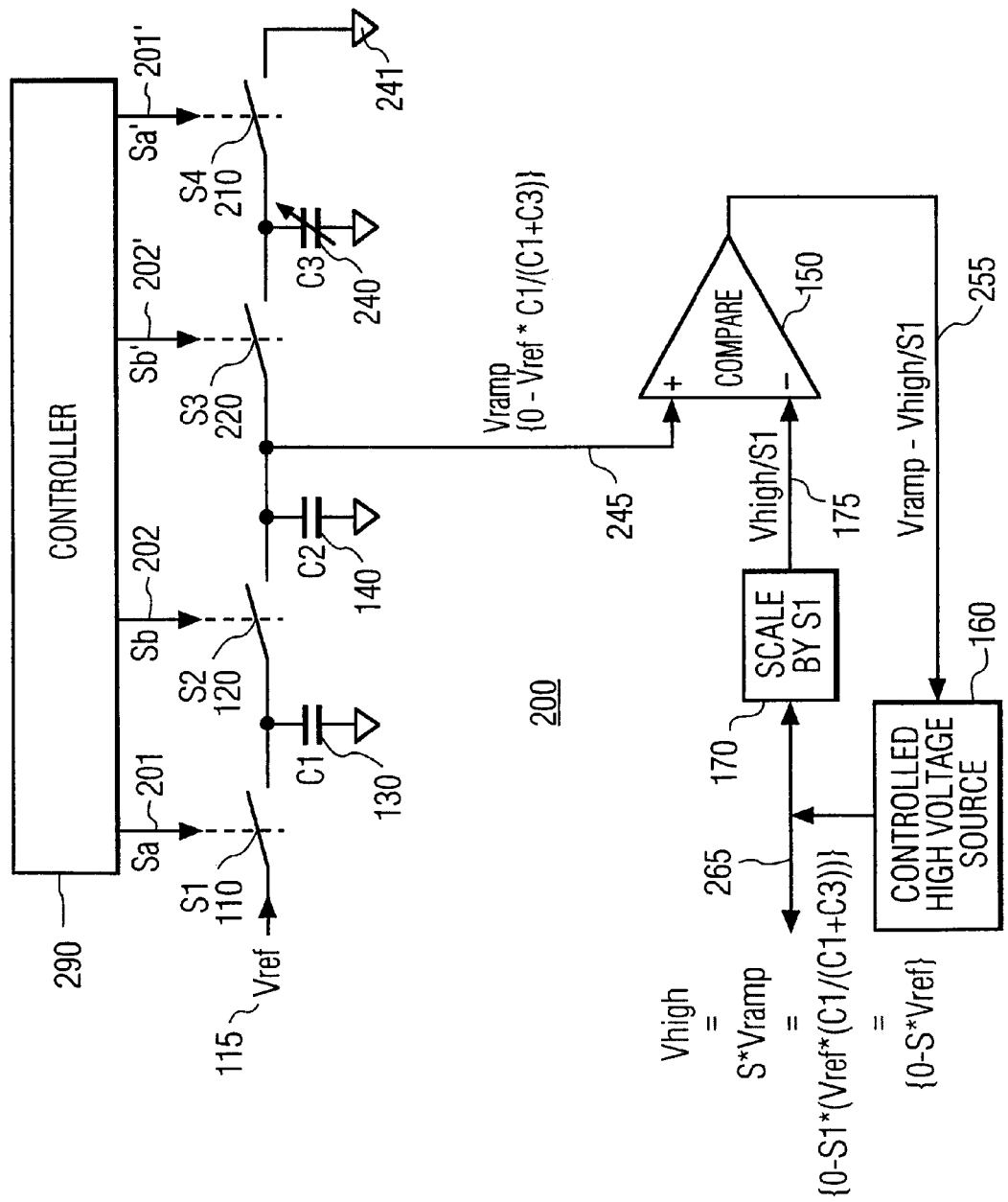
FIG. 2 illustrates an example high-voltage reference generator in accordance with this invention.

FIG. 2 illustrates an example high-voltage reference generator 200 in accordance with this invention. As in the prior art generator 100 of FIG. 1, the high-voltage reference generator 200 includes a comparator 150, a voltage controlled high voltage source 160, and scaler 170 to effect a feedback circuit that controls the output voltage 265 to a scaled value of the alternative input 245 of the comparator 150. As compared to the prior art generator 100, the generator 200 provides a programmable scaled value 245 of the reference voltage 115 as the alternative input 245 to the comparator 150. Thus, the feedback signal 255 that controls the voltage source 160 is based on the difference between the scaled value 175 of the output voltage 265 and a programmed scaled value 245 of the fixed reference voltage 115.

A voltage divider network comprising C1 130, C2 140, and C3 240 provides the programmable reference voltage 245 in a preferred embodiment. The capacitance of capacitor C3 240 is variable, preferably by program command, as will be detailed below. In operation, a controller 290 asserts control signals Sa 201 and Sa' 201' to place charge onto capacitor C1 130, and simultaneously remove charge from capacitor C3 240. The charge is placed on the capacitor C1 130 from the reference voltage Vref 115, via switch S1 110, and the charge is removed from the capacitor C3 240 to a ground reference 241, via switch S4 210. Thereafter, the controller 290 de-asserts control signals Sa 201 and Sa' 201', and asserts control signals Sb 202 and Sb' 202', and the charge on capacitor C1 130 is shared among the capacitors C2 140 and C3 240, via switches S2 120 and S3 220. Thus, as compared to the conventional generator 100 of FIG. 1, the capacitor C2 140 receives a smaller proportion of the charge from capacitor C1 130, the smaller proportion being determined by the relative size of capacitor C3 240 compared to capacitor C1 130. Repeated cycles of alternating assertions and de-assertions of the control signals Sa 201, Sa' 201' and Sb 202, Sb' 202' add repeated charge to capacitor C2 140, while repeatedly depleting a portion of the charge via capacitor C3 240. The steady state voltage on the capacitor C2 140 is proportional to the reference voltage 115, the proportion being determined by the ratio of the capacitance of C1 130 to the total capacitance of C1 130 and C3 240. To deplete the charge on capacitor C2 and return its voltage 245, and corresponding, the output voltage 265, to zero, the controller 290 asserts control signals Sa' 201' and Sb' 202' simultaneously, while Sb 202 is de-asserted.

Figure 3:
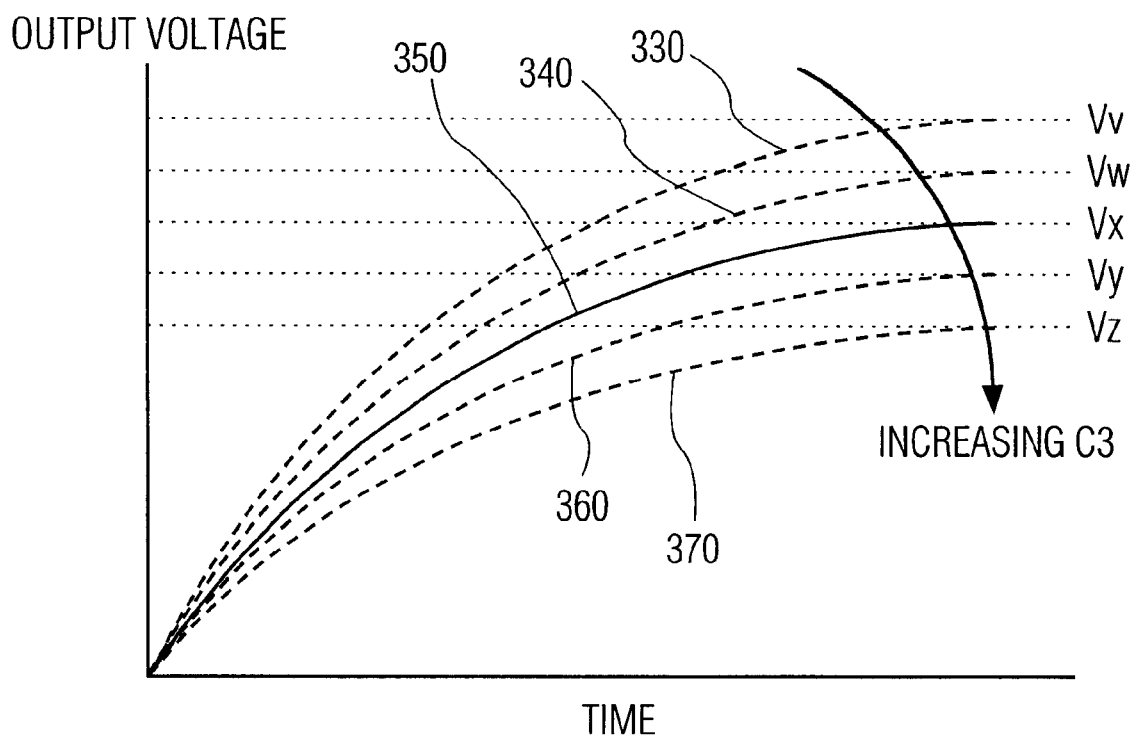
FIG. 3 illustrates an example timing diagram of a high-voltage reference generator in accordance with this invention.

FIG. 3 illustrates an example timing diagram for the resultant ramp voltage Vramp 245 as a function of the capacitance C3. Illustrated in FIG. 3 are five voltages Vv, Vw, Vx, Vy, and Vz corresponding to five values of C3 240, from a low value through increasingly higher values, respectively. As in the prior art device 100, the voltage output 265 is a scaled, typically higher, value of the ramp voltage Vramp 245 at the alternative input of the comparator 150, via the operation of the controlled voltage source 160 and scaler 170, as detailed above.

Figure 4:
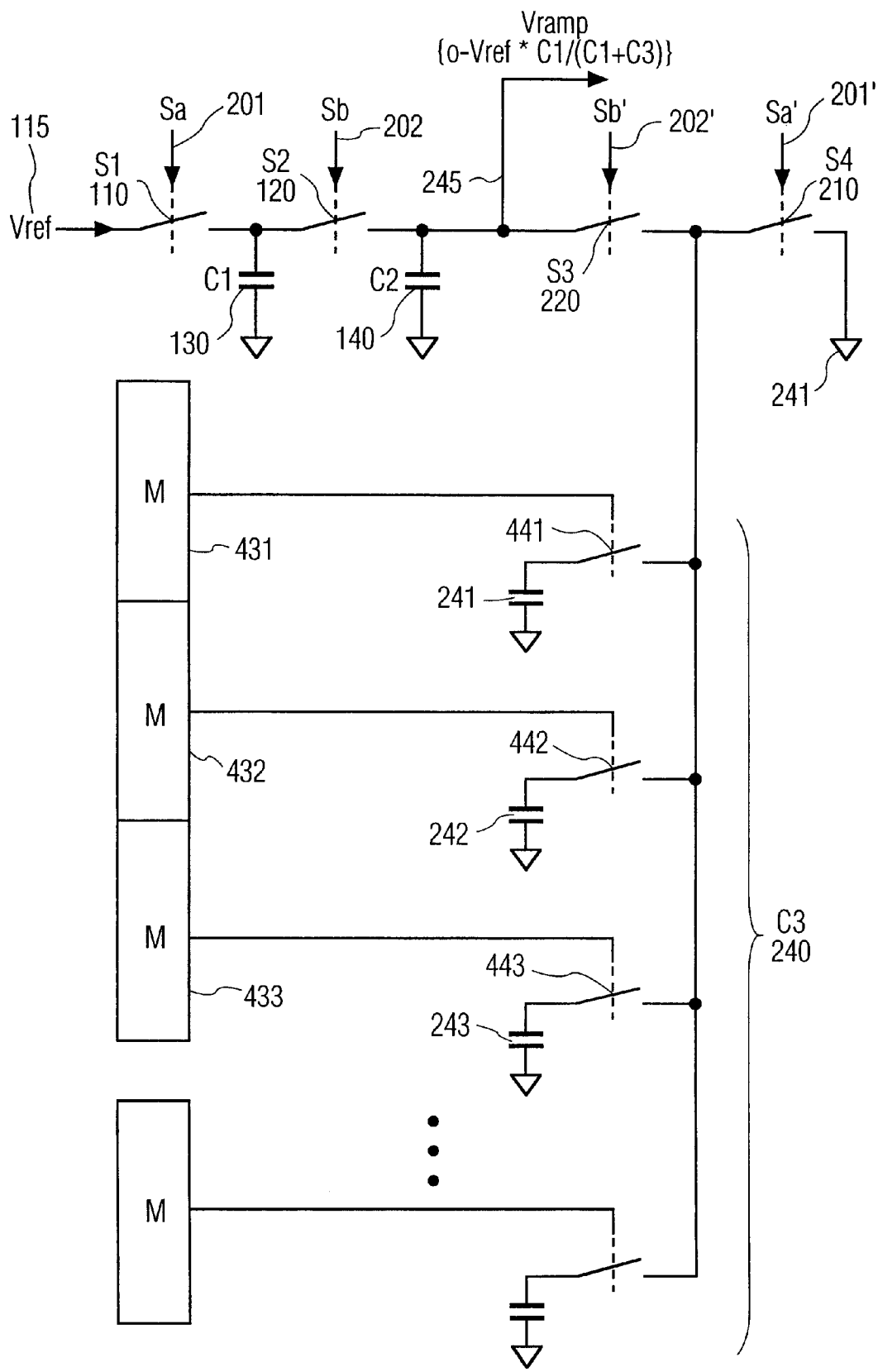
FIG. 4 illustrates an example embodiment of a circuit that provides the programmable voltage reference in accordance with this invention.

FIG. 4 illustrates an example block diagram of a voltage divider network with a programmable capacitor C3 240 that comprises selectable capacitors 241, 242, 243, etc. These capacitors are selectable via switches 441, 442, 443, etc. that are controlled by memory elements 431, 432, 433, etc. Alternative means of providing a programmable capacitor C3 240 are common in the art. In a preferred embodiment of this invention, the capacitors 241, 242, 243, etc. are decreasingly sized in a binary manner. Capacitor 242 is half the capacitance of capacitor 241; capacitor 243 is half the capacitance of capacitor 242; and so on. In this manner, N capacitors 241, 242, 243, . . . can be configured to provide $2^N$ evenly spaced capacitance values. Of note, memory element 431 is configured to select capacitor 241 in opposition to the sense of the other memory elements 432, 433, etc. In this manner, an initialization of each of the memory elements to the same default value provides a selected capacitance value of approximately half the range of the available selection of capacitance values. In a preferred embodiment of this invention, this mid-range value is designed such that the resultant programmed reference voltage 245 corresponds to a nominal target value, so that an adjustment of the capacitance 240 effects an increase or decrease relative to this nominal target value. For example, in FIG. 3, the programmed reference value Vx is the nominal target value, about which alternative higher Vv, Vw and lower Vy, Vz voltages can be selected, via a selection of the appropriate capacitors 241, 242, 243, etc. Capacitors C1 and C2 are determined based on this desired nominal voltage Vx. Similarly, the nominal scaling factor S in the scaler 170 of FIG. 2 is determined based on this nominal voltage Vx and the corresponding desired nominal voltage level at the output voltage 265. Any number of means, common in the art, can be used to determine the appropriate component values corresponding to the desired nominal value for the output voltage 265. The subsequent selection of alternative capacitors 241, 242, 243, etc. effects a change to this output voltage, as required, to optimize the performance and longevity of the device that uses the generator 200 that contains the programmable capacitor C3 240.

The foregoing merely illustrates the principles of the invention. It will thus be appreciated that those skilled in the art will be able to devise various arrangements which, although not explicitly described or shown herein, embody the principles of the invention and are thus within its spirit and scope. For example, the controls for the switches 241, 242, 243, etc. may be derived from logic devices, rather than the memory elements 431, 432, 433, etc. In like manner, particular capacitors 241, 242, 243, etc. may be used to effect a voltage level shift for differing modes of operation. For example, the optimal voltage level to effect a memory erasure is typically lower than the optimal voltage level to write a data value into the memory element. A specific capacitor 241, 242, 243, etc., or an independently switchable capacitor (not shown) can be selectively connected or disconnected to the capacitors that form the dividing capacitor C3 240. Selectively connecting or disconnecting such a capacitor effects a voltage level change in the output voltage 265, as discussed above. In like manner, the programmed reference voltage 245 need not be a highly accurate reference voltage 115, for applications in which the programmed reference voltage 245 is customized for each device. In these applications, the capacitor 240 is trimmed to also compensate for any inaccuracies in the reference voltage 115. These and other system configuration and optimization features will be evident to one of ordinary skill in the art in view of this disclosure, and are included within the scope of the following claims.

I claim:

1. A voltage generator comprising;
    a voltage source that provides an output voltage in dependence upon a feedback signal, a scaler, operably coupled to the voltage source, that scales the output voltage to form a scaled output voltage, a comparator, operably coupled to the scaler, that provides the feedback signal in dependence upon a comparison between the scaled output voltage and a programmed reference voltage, and a divider network, operably coupled to a fixed reference voltage and to the comparator, that provides the programmed reference voltage having a maximum value that is less than the fixed reference voltage, wherein the maximum value of the programmed reference voltage is based on component values of one or more components within the divider network, the one or more components within the divider network include:

a first capacitor, operably coupled to the reference voltage, and a programmed capacitor, operably coupled to the first capacitor and to the programmed reference voltage, and the maximum value is dependent upon a ratio that includes the capacitance value of the first capacitor and a capacitance value of the programmed capacitor.

2. The voltage generator of claim 1, wherein the one or more components within the divider network further include a second capacitor, operably coupled to the first capacitor and the programmed capacitor, that provides the programmed reference voltage, such that the programmed referenced voltage increases from zero to the maximum value.

3. The voltage generator of claim 2, wherein the divider network further includes:

a first switch that operably couples the fixed reference voltage to the first capacitor, a second switch that operably couples the first capacitor to the second capacitor, a third switch that operably couples the second capacitor and the programmed capacitor, a fourth switch that operably couples the programmed capacitor to an other reference voltage source, and, a controller that controls the first switch, the second switch, the third switch, and the fourth switch to provide the programmed reference voltage that increases from zero to the maximum value.

4. The voltage generator of claim 1, wherein the programmed capacitor includes:

a plurality of selectable capacitors, and a plurality of memory cells, each memory cell of the plurality of memory cells, corresponding to each selectable capacitor of the plurality of selectable capacitors, wherein a capacitance value associated with the programmed capacitor is based on a state of each memory cell corresponding to each selectable capacitor.

5. A memory device comprising:

a plurality of memory elements, and a voltage generator, operably coupled to the plurality of memory elements, that provides an output voltage that is dependent upon a comparison of a scaled value of the output voltage and a reference voltage, the output voltage being used to effect a writing of a data item to a memory element of the plurality of memory elements, wherein the reference voltage has a maximum value that is based on component values of one or more components in the voltage generator, thereby allowing the maximum value of the reference voltage to be changed via a change of one or more of the component values of the one or more components, the voltage generator comprises:

a voltage source that provides the output voltage in dependence upon a feedback signal, a scaler, operably coupled to the voltage source, that scales the output voltage to provide the scaled value of the output voltage, a comparator, operably coupled to the scaler, that provides the feedback signal in dependence upon a comparison between a first input signal corresponding to the scaled value of the output voltage and a second input signal corresponding to the reference voltage and a divider network, operably coupled to a fixed reference voltage and to the comparator, that includes the one or more components, and is configured to provide the reference voltage, such that the maximum value of the reference voltage is less than the fixed reference voltage, the one or more components within the divider network include:

a first capacitor, operably coupled to the reference voltage, and a programmed capacitor, operably coupled to the first capacitor and to the second input of the comparator, and the maximum value of the reference voltage is dependent upon a ratio that includes a capacitance value of the first capacitor and a capacitance value of the programmed capacitor.

6. The memory device of claim 5, wherein:

the output voltage is also used to effect an erasing of the plurality of memory elements, and the programmed capacitor includes a selectable capacitor that is used to effect a change in the output voltage to facilitate the erasing of the plurality of memory elements.

7. The memory device of claim 5, wherein:

the programmed capacitor includes a plurality of selectable capacitors, and a plurality of memory cells, each memory cell of the plurality of memory cells corresponding to each selectable capacitor of the plurality of selectable capacitors, and a capacitance value associated with the programmed capacitor is based on a state of each memory cell corresponding to each selectable capacitor.

8. The memory device of claim 5, wherein the one or more components within the divider network further include a second capacitor, operably coupled to the first capacitor and the programmed capacitor, that provides the second input signal to the comparator, such that the second input signal increases from zero to the maximum value of the reference voltage.

9. The memory device of claim 8, wherein the divider network further includes:

a first switch that operably couples the fixed reference voltage to the first capacitor, a second switch that operably couples the first capacitor to the second capacitor, a third switch that operably couples the second capacitor and the programmed capacitor, a fourth switch that operably couples the programmed capacitor to an other reference voltage source, and, a controller that controls the first switch, the second switch, the third switch, and the fourth switch to provide the second input signal that increases from zero to the maximum value of the reference voltage.

10. A method of providing a controlled output voltage, comprising:

scaling a first reference voltage to provide a second reference voltage that has a maximum value that is determined by one or more component values, thereby allowing for a change in the maximum value of the second reference voltage via a change of one or more of the one or more component values, comparing the second reference voltage to a scaled output voltage to produce a feedback voltage, producing the controlled output voltage based on the feedback voltage, and scaling the controlled output voltage to produce the scaled output voltage, wherein the scaling of the first reference voltage includes coupling a first capacitor to the first reference voltage, distributing a charge from the first capacitor to a second capacitor and to a programmed capacitor, discharging the programmed capacitor, and, providing the second reference voltage from the second capacitor, and the one or more component values that determine the maximum value of the second reference voltage include capacitance values of the first capacitor and the programmed capacitor.

11. The method of claim 10, wherein:

the programmed capacitor includes a plurality of selectable capacitors, and a plurality of memory cells, each memory cell of the plurality of memory cells, corresponding to each selectable capacitor of the plurality of selectable capacitors, and the capacitance value associated with the programmed capacitor is based on a state of each memory cell corresponding to each selectable capacitor.

* * * * *